United States Patent
Heiland

(10) Patent No.: US 7,942,379 B2
(45) Date of Patent: May 17, 2011

(54) ACTIVE VIBRATION ISOLATION SYSTEM WITH A COMBINED POSITION ACTUATOR

(75) Inventor: Peter Heiland, Raunheim (DE)

(73) Assignee: Integrated Dynamics Engineering GmbH (DE)

( * ) Notice: Subject to any disclaimer, the term of this patent is extended or adjusted under 35 U.S.C. 154(b) by 1008 days.

(21) Appl. No.: 11/750,243

(22) Filed: May 17, 2007

(65) Prior Publication Data

US 2007/0272820 A1    Nov. 29, 2007

(30) Foreign Application Priority Data

May 20, 2006  (EP) .................................... 06010461

(51) Int. Cl.
  *F16F 15/02*  (2006.01)
  *G03F 7/20*   (2006.01)
  *F15B 21/04*  (2006.01)

(52) U.S. Cl. ..... 248/618; 248/638; 267/136; 267/64.28; 188/378; 188/380; 73/665; 700/280

(58) Field of Classification Search ............... 248/638, 248/560, 566, 603, 618, 633; 267/136, 64.28; 188/378, 380; 73/662, 663, 665; 700/280, 700/281

See application file for complete search history.

(56) References Cited

U.S. PATENT DOCUMENTS

| | | | |
|---|---|---|---|
| 4,546,426 A * | 10/1985 | Hafner et al. | 700/33 |
| 5,285,995 A | 2/1994 | Gonzalez et al. | |
| 6,036,162 A | 3/2000 | Hayashi | |
| 6,202,492 B1 | 3/2001 | Ohsaki | |
| 6,523,695 B1 | 2/2003 | Ueta et al. | |
| 6,563,128 B2 * | 5/2003 | Lublin et al. | 250/548 |
| 6,872,961 B2 * | 3/2005 | Jacques et al. | 250/548 |
| 7,069,114 B2 * | 6/2006 | Morisada | 700/280 |
| 7,571,793 B2 * | 8/2009 | Warmerdam et al. | 188/378 |
| 2010/0204881 A1 * | 8/2010 | Muragishi et al. | 701/36 |
| 2010/0211225 A1 * | 8/2010 | Heiland | 700/280 |

FOREIGN PATENT DOCUMENTS

| | | |
|---|---|---|
| JP | 10-89403 A | 4/1998 |
| JP | 2002175122 A | 6/2002 |

OTHER PUBLICATIONS

Y. Shomura, "Japanese Office Action for International Application No. 2007-132881", Jun. 25, 2010, Publisher: Japanese Patent Office.

* cited by examiner

*Primary Examiner* — Anita M King
(74) *Attorney, Agent, or Firm* — DeMont & Breyer LLC

(57) ABSTRACT

The invention relates to a vibration isolation system, comprising at least one fluid bearing having a first control device in order to control the fluid pressure and having at least one actuator in order to compensate for position changes of the load to be isolated, which actuator is controlled by at least one second control device, wherein the input of one control device is connected to the output of the other control device.

10 Claims, 2 Drawing Sheets

ACTIVE VIBRATION ISOLATION SYSTEM WITH A COMBINED POSITION ACTUATOR

FIELD OF THE INVENTION

The invention relates to an active vibration isolation system, in particular to a vibration isolation system having air bearings.

BACKGROUND TO THE INVENTION

Vibration isolation systems are known. For example, EP 927 380 B1 discloses a vibration isolation system having air bearings, which is used in particular as the bearing for a lithography appliance. The disclosure content of this Laid Open Specification is hereby made the subject matter of the application.

Vibration isolation systems such as these are used in many other areas of technology. Particularly in the semiconductor industry, the requirements for the vibration isolation system on which, for example, manufactured installations are mounted are becoming more stringent as miniaturization progresses further.

Vibration isolation systems having air bearings may have an active control system in which one or more position sensors detect the position of the load to be mounted, with the compressed-air supply to the air bearings being controlled on the basis of the position detection. If the vibration isolation system is loaded with a relatively heavy load, active control such as this automatically increases the air pressure, thus providing level compensation.

The control loop which provides this level compensation is relatively slow because of the pneumatic valves, which respond relatively slowly, and because of the large volume of air in the system, generally achieving a control bandwidth of less than 3 Hz. High-frequency vibration therefore cannot effectively be counteracted by this control loop. In fact, only level compensation is essentially feasible.

In order to make it possible to reduce more rapid position changes, for example caused by vibration resulting from resonances, vibration isolation systems exist which, in addition to control of the compressed-air supply, have actuators which act on the load to be isolated without contact, and are operated via a further control loop.

For actuators such as these, which may be in the form of magnetic actuators or piezo-actuators, the corresponding control loops achieve control bandwidths with frequencies of more than 200 Hz. One disadvantage that has been found is that these actuators draw a large amount of current and, since they operate independently of the pneumatic control, frequently counteract the pneumatic control.

OBJECT OF THE INVENTION

In contrast, the invention is based on the object of improving the interaction of the fluid-pressure control loop with the actuator control loop.

One particular object of the invention is to reduce the current drawn by the actuators.

A further object of the invention is to further improve the isolation effect of a vibration isolation system.

SUMMARY OF THE INVENTION

The object of the invention is achieved simply by a vibration isolation system and by a method for vibration isolation as claimed in one of the independent claims.

Preferred embodiments and a development of the invention are specified in the respective dependent claims.

A vibration isolation system is accordingly provided which has at least one fluid bearing with a first control device in order to control the fluid pressure, and an actuator in order to actively compensate for position changes of the load to be isolated, with the actuator being controlled by a second control device.

The first and the second control device are in this case connected to at least one sensor, which detects the position of the load to be supported.

According to the invention, one input of one control device is connected to the output of the other control device. The control devices are thus cascaded. This results in the two control loops operating such that they are matched to one another. In particular, this reduces the current drawn by the actuators.

For the purposes of the invention, it is not essential for the control devices to be arrangements which are separated physically and/or by circuitry, and in fact the two control devices may also be combined in a single component, for example with a computer being able to control both the liquid bearing and the actuators. The control system according to the invention may therefore also be purely software-based and can accordingly be retrofitted without major effort.

The input of the first control device, that is to say of the control device for the fluid pressure, is preferably connected to the output of the second control device, the control device for the actuator. This results in the control signal for the force actuator being regulated at zero by means of the fluid control system. The slower fluid control loop provides position control for the actuator in the case of slow movements.

The actuators have to act only in order to compensate for rapid position changes.

However, an opposite cascaded circuit is also feasible, as is provided in one alternative embodiment of the invention, in which the input of the second control device is connected to the output of the first control device.

At least the input of the second control device is preferably connected to at least one position sensor, which records the bearings of the load to be isolated, in at least one spatial direction. Sensors which detect position changes in all three spatial directions are preferably used.

The fluid bearing is preferably an air bearing. The vibration isolation system preferably has at least three air bearings such as these, so that a load to be supported is supported completely on air bearings.

Magnetic actuators, in particular plunger-type coils with a permanent magnet, or piezo-actuators are preferably used as actuators. Actuators such as these can be used to act on the load to be supported without any contact being made. This prevents the actuators from introducing vibration, in particular high-frequency vibration, into the system.

The control device for the fluid bearing or bearings operates with a control bandwidth with a narrow frequency range, with the control bandwidth preferably not extending above 20 Hz, preferably above 10 Hz, and particularly preferably above 5 Hz.

In contrast, the bandwidth of the second control device also detects higher frequencies, in particular vibration caused by resonant frequencies of the building or by components of the vibration isolation system. In this case, control bandwidths are possible which cover frequencies above 50 Hz, preferably above 100 Hz, and particularly preferably even above 200 Hz.

The fluid pressure is preferably controlled via an electropneumatic valve. A valve such as this can easily be actuated. Valves which operate essentially without any hysteresis loop are preferably used.

The invention also relates to a method for vibration isolation in which a load to be isolated is mounted on fluid bearings and the fluid pressure of the bearing is controlled via at least one control device, which is connected to a sensor for detecting the position of the load to be isolated. The first control device therefore initially provides a form of level compensation.

Furthermore, at least one actuator which is controlled by a second control device provides additional active vibration isolation which, in particular, reduces relatively high frequency vibration.

According to the invention, the output signal from one control device is passed as an input signal to the other control device. The control devices are therefore cascaded.

The output signal from the second control device, that is to say from the control device for the actuator or actuators, is preferably passed as an input signal to the first control device. The cascaded connection results in the control signal for the actuators being regulated by the fluid control system at zero.

It is self-evident that the output signal need not necessarily be understood as being precisely the signal which controls the actuators, for example as a voltage signal. In fact, these may be signals which have a fixed mathematical relationship with this signal. For example, it may be worthwhile reducing the voltage signal for the force actuators before passing it to the control device for the fluid control system, for example by means of a voltage divider, since one control device is operated with a lower voltage.

The fluid pressure is preferably controlled with a narrower control bandwidth than the actuator or actuators. The fluid pressure control system therefore lags behind the actuator control system and regulates the control signal for the actuators at zero for slow vibration frequencies. The actuators are therefore activated only in order to reduce vibration frequencies which cannot be coped with by the slow fluid pressure control system.

DESCRIPTION OF THE DRAWINGS

The invention will be explained in more detail in the following text with reference to FIG. 1 and FIG. 2, in which.

DETAILED DESCRIPTION OF THE DRAWINGS

Figure 1:
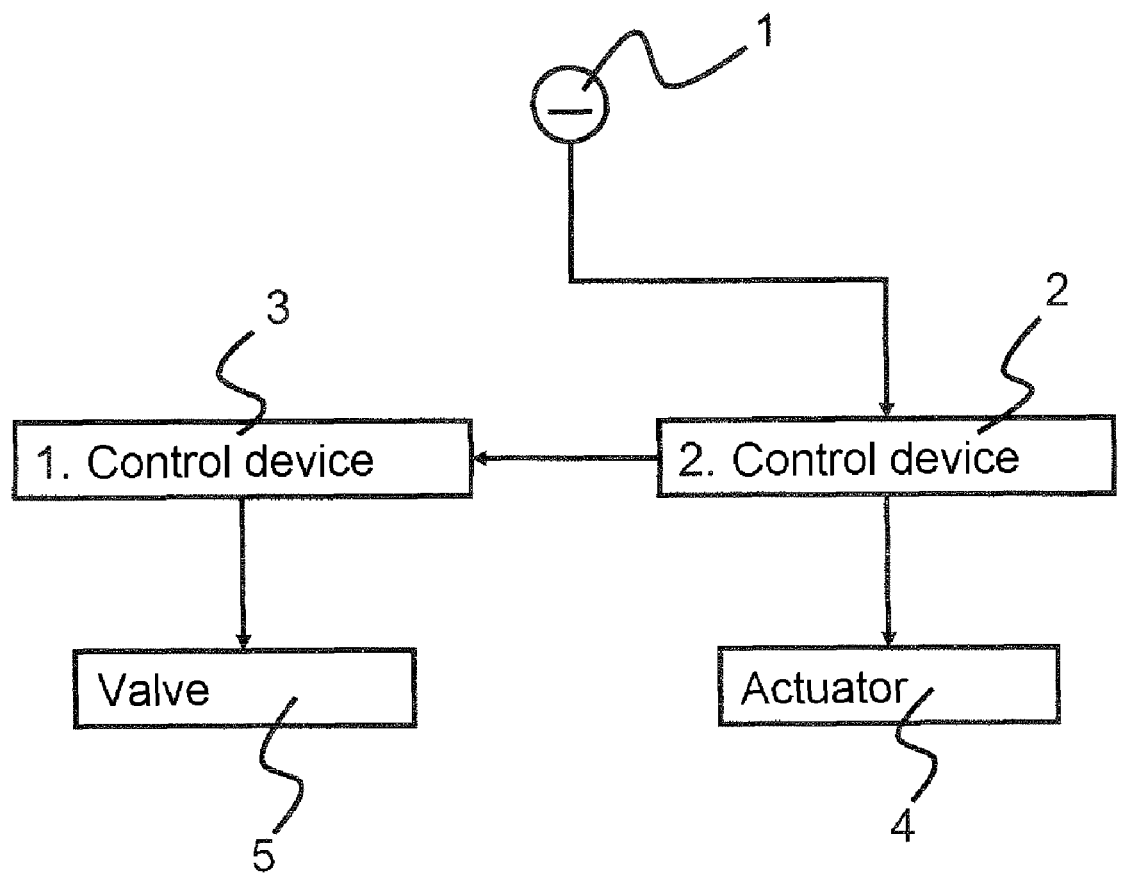
FIG. 1 shows, schematically, a block diagram of the major components of a vibration isolation system according to the invention.

The block diagram in FIG. 1 shows, schematically, the interaction of the various components of a vibration isolation system according to the invention. The vibration isolation system has at least one position sensor 1, which detects the position of a load (not illustrated) to be isolated. The output signal from the position sensor 1 is passed to a control device for control of the actuators, the second control device 2. The second control device 2 generates an output signal which controls the actuator or actuators 4.

At the same time, an output signal from the second control device 2 is passed to the control device for controlling the fluid pressure, the first control device 3. The first control device 3 therefore uses the output signal from the second control device 2 as an input signal. The control devices 2, 3 are cascaded.

The valve or valves 5 for controlling the fluid pressure is or are controlled via the output signal from the first control device 3. The fluid pressure control system therefore lags behind the actuator control system. The actuators are activated only in order to reduce vibration frequencies which cannot be coped with by the slow fluid pressure control system. The control signal for the actuators 4 is regulated, as a trend, toward zero by the fluid pressure control system.

Figure 2:
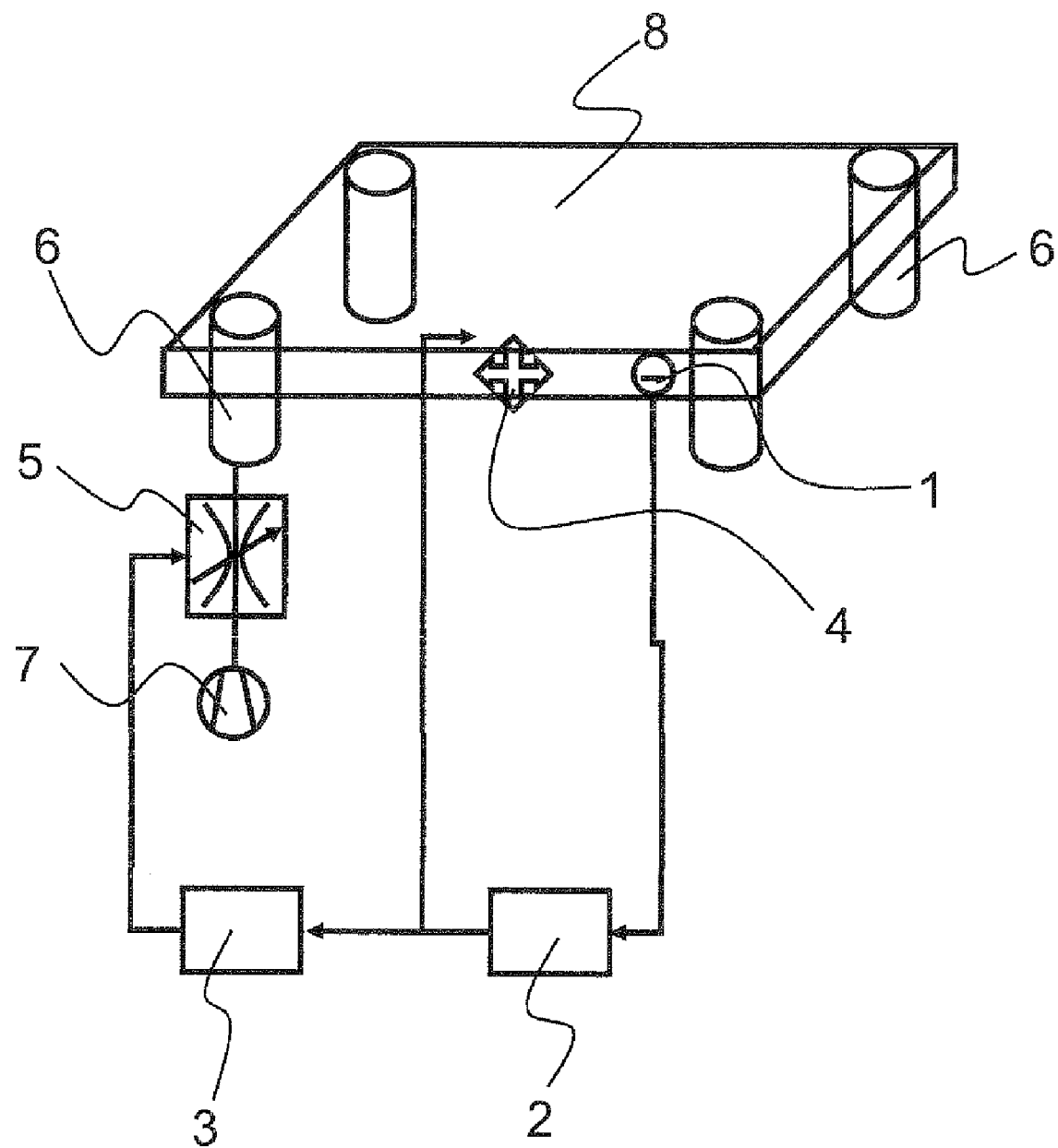
FIG. 2 shows schematically, one exemplary embodiment of a vibration isolation system.

FIG. 2 shows, schematically, a vibration isolation system. The vibration isolation system comprises a plate 8 on which objects to be isolated (not illustrated) can be mounted. The plate 8 is therefore at the same time part of the load to be isolated. The plate 8 is mounted on four air bearings 6.

The vibration isolation system comprises an active control system. The pressure for the air bearings 6 is controlled via a valve 5. The necessary pressure is supplied by a pump 7.

The valve is controlled via the control device for the fluid pressure, the first control device 3.

For position compensation, the vibration isolation system has a position sensor 1 whose output signal is passed to the second control device 2. The second control device 2 generates an output signal, and passes this to at least one actuator 4, which actively counteracts vibration. At the same time, an output signal is passed to the control device for the fluid pressure, the first control device 3. The two control devices 2 and 3 are thus cascaded.

It is self-evident that the invention is not restricted to a combination of the features of the exemplary embodiments described above, but that a person skilled in the art will in fact combine the features as required, where this is worthwhile.

The invention claimed is:

1. A vibration isolation system, comprising a fluid bearing having a first control device in order to control fluid pressure and having an actuator in order to compensate for position changes of a load to be isolated, wherein the actuator is controlled by a second control device,
   wherein an output of the second control device for controlling the actuator is connected to an input of the first control device for controlling the fluid pressure of the fluid bearing.

2. The vibration isolation system as claimed in claim 1, wherein the input of the second control device is connected to at least one position sensor which records the position of the load to be isolated in at least one spatial direction.

3. The vibration isolation system as claimed in claim 1, wherein the fluid bearing is an air bearing.

4. The vibration isolation system as claimed in claim 1, wherein magnetic actuators are provided as actuators.

5. The vibration isolation system as claimed in claim 1, wherein a control bandwidth of the first control device is less than 20 Hz.

6. The vibration isolation system as claimed in claim 1, wherein a control bandwidth of the second control device covers frequencies above 50 Hz.

7. The vibration isolation system as claimed in claim 1, wherein the fluid pressure is controlled via at least one electropneumatic valve.

8. The vibration isolation system as claimed in claim 1, wherein the first and the second control device are combined in one appliance.

9. A method for vibration isolation, in which a load to be isolated is mounted on fluid bearings and fluid pressure is controlled via a first control device, which is connected to a sensor for detecting the position of the load to be isolated, with an actuator being controlled via a second control device, wherein an output signal from the second control device is passed as an input signal to the first control device and wherein the fluid pressure is controlled with a narrower control bandwidth than the actuator.

10. The method for vibration isolation as claimed in claim 9, wherein the fluid pressure is operated with a control bandwidth of less than 10 Hz and the actuator is operated with a control bandwidth of up to more than 50 Hz.

* * * * *